United States Patent
Tiberghien et al.

(10) Patent No.: US 9,194,634 B2
(45) Date of Patent: Nov. 24, 2015

(54) COOLING SYSTEM WITH COOLANT CIRCULATION DUCT

(71) Applicant: STAUBLI FAVERGES, Faverges (FR)

(72) Inventors: Alain-Christophe Tiberghien, Sevrier (FR); Christophe Durieux, Gilly sur Isere (FR); Frederick Morel, Lathuile (FR)

(73) Assignee: STAUBLI FAVERGES, Faverges (FR)

( * ) Notice: Subject to any disclaimer, the term of this patent is extended or adjusted under 35 U.S.C. 154(b) by 248 days.

(21) Appl. No.: 13/752,674

(22) Filed: Jan. 29, 2013

(65) Prior Publication Data

US 2013/0192800 A1    Aug. 1, 2013

(30) Foreign Application Priority Data

Jan. 31, 2012    (FR) ...................................... 12 50921

(51) Int. Cl.
*F28F 27/00* (2006.01)
*F28F 9/02* (2006.01)
(Continued)

(52) U.S. Cl.
CPC ................. *F28F 27/00* (2013.01); *F16L 37/34* (2013.01); *F16L 37/56* (2013.01); *F28F 9/0253* (2013.01); *F28F 9/0258* (2013.01); *H05K 7/20272* (2013.01); *F28D 1/035* (2013.01); *F28F 3/12* (2013.01); *F28F 7/02* (2013.01); (Continued)

(58) Field of Classification Search
CPC ....... F28F 27/00; F28F 9/0253; F28F 9/0258; F16L 37/34; F16L 37/56; F16L 29/00; F16L 29/04; F16L 37/28; F16L 37/30; F16L 37/32; H05K 7/20272

USPC ............................. 137/614; 251/149.1, 149.6
See application file for complete search history.

(56) References Cited

U.S. PATENT DOCUMENTS

| | | | |
|---|---|---|---|
| 2,463,326 | A | 3/1949 | Smisko et al. |
| 5,215,122 | A | 6/1993 | Rogers et al. |

(Continued)

FOREIGN PATENT DOCUMENTS

| | | |
|---|---|---|
| EP | 1357325 A2 | 10/2003 |
| EP | 1790458 A1 | 5/2007 |
| JP | 4229216 A | 8/1992 |

OTHER PUBLICATIONS

French Search Report for priority FR 1250921, Aug. 2012.

*Primary Examiner* — Kevin Lee
(74) *Attorney, Agent, or Firm* — Dowell & Dowell, PC

(57) ABSTRACT

A cooling system that includes a heat exchange plate defining a coolant circulation duct and equipped with connector elements each having a closure member for opening and closing the connector elements to the coolant circulation duct, a volume compensating device including a piston mounted to slide, relative to the plate, between a first retracted position and a second forward position, and wherein the system includes a coolant supply for the duct and a coolant discharge for the duct each of which includes connecting elements complementary to the connector elements of the plate, and wherein a maintaining member is secured to at least a first complementary connector element to lock the piston in the first position, when a first connector element of the plate and the first complementary connecting element are coupled, and retains the piston in the first position, during separation of the first connector element of the plate and the first complementary connecting element and until the closure member of the first connector element close any flow through the connector element.

14 Claims, 6 Drawing Sheets

(51) Int. Cl.
  *H05K 7/20* (2006.01)
  *F16L 37/34* (2006.01)
  *F16L 37/56* (2006.01)
  *F28F 3/12* (2006.01)
  *F28F 7/02* (2006.01)
  *F28D 1/03* (2006.01)
(52) U.S. Cl.
  CPC ........ *F28F 2265/12* (2013.01); *F28F 2265/14* (2013.01); *F28F 2265/16* (2013.01)

(56) References Cited

U.S. PATENT DOCUMENTS

| | | | | |
|---|---|---|---|---|
| 5,469,887 | A * | 11/1995 | Smith, III | 137/614.04 |
| 6,394,131 | B1 * | 5/2002 | Fross et al. | 137/614.05 |
| 7,841,580 | B2 * | 11/2010 | Konishi et al. | 251/149.6 |
| 2003/0201017 | A1 | 10/2003 | Knuthson | |
| 2008/0245426 | A1 | 10/2008 | Smith, III | |

\* cited by examiner

COOLING SYSTEM WITH COOLANT CIRCULATION DUCT

BACKGROUND OF THE INVENTION

1. Field of the Invention

The invention relates to a system for cooling at least one component of a part, in which a plate is used comprising a coolant circulation duct. The invention is in particular applicable in the field of the temperature control of electronic components and in the field of injection molding of parts made from a synthetic material, in which field molds must be cooled.

2. Brief Discussion of the Prior Art

In the case of a heat exchange plate designed to cool electronic components, a coolant circulation duct is defined inside the plate and designed to be connected, by both ends thereof, to a supply duct, which in turn is connected to a refrigerated coolant supply group, as well as a duct for discharging that fluid. When the duct of the plate is disconnected from the supply duct, while the still-hot electronic components are transmitting calories to the coolant confined in the duct, said coolant undergoes a temperature increase accompanied by a pressure increase of a nature to cause ruptures in the duct or its connection elements. Similar problems arise in the field of injection molding, where the molds are subjected to temperature increases, whereas their coolant circulation duct is isolated from its supply.

EP-A-1 790 458 resolves these problems by proposing a volume compensator formed by a piston subject to the pressure prevailing in a coolant circulation duct and suitably sliding relative to the plate. "Compensation" refers to an adjustment of the volume available for the confined fluid under the effect of the pressure of the fluid so as to limit its pressure variations. This piston is subject to the action of a spring that returns it to a position retracted inside the plate once the pressure from the coolant in the duct decreases. This solution is generally satisfactory, in particular inasmuch as no action by the operator is required on the compensation device during successive disconnections/reconnections of the plate with the corresponding supply and discharge ducts. Furthermore, the volume compensation takes place without coolant leakage. However, to be effective, this equipment requires excellent control of the elastic return force exerted by the spring and the friction forces from the piston inside the body in which it slides. This spring must combat said friction forces, while the pressure force that moves the piston must overcome the elastic force due to the spring. This compensation device is therefore not very sensitive to small pressure variations. Furthermore, in the event the spring fails, this device is not able to guarantee that a sufficient expansion volume is available for the coolant.

SUMMARY OF THE INVENTION

The invention more particularly aims to resolve these drawbacks by proposing a new cooling system in which a volume compensation may be obtained to account for a pressure increase in the duct of the heat exchange plate, without it being necessary to use a spring acting on a piston and without it being necessary to arm the system through a related maneuver upon each disconnection/reconnection of the plate with the associated supply and discharge ducts.

To that end, the invention relates to a system for cooling at least one component or part, said system comprising a heat exchange plate that comprises a coolant circulation duct and that is equipped, on the one hand, at the ends with connector elements each provided with a closure member and, on the other hand, a volume compensating device comprising a piston mounted able to slide sealably relative to the plate, between a first retracted position and a second forward position relative to the retracted position in which the volume available for the coolant in the duct is increased relative to its volume in the first position. The system also comprises supply and/or discharge means for the cooling duct, said means comprising connecting elements complementary to those of the plate for the connection and disconnection of the duct of the plate with a supply source and/or a coolant discharge line. According to the invention, a member for keeping the piston in its retracted position is secured to at least a first complementary connector element of a first connector element of the plate, at least in translation along the fitting axis thereof. Furthermore, this maintaining member is capable of locking the piston in its first position when the first connector element of the plate and the first complementary connector element are coupled and capable of keeping the piston in its first position, during the separation of the first connector element of the plate and the first complementary connector element, at least as long as the closure member of the first connector element of the plate is not in the position closing off an duct of that connector element.

Owing to the invention, the maintaining member ensures that, during the separating or disconnection maneuver of the connector elements, the piston of the compensation device is positioned in its first retracted position upon closure of the circulation duct so as to guarantee the available volume for the volume compensation when the connector elements have been separated.

According to advantageous but optional aspects of the invention, such a cooling system may incorporate one or more of the following features considered in any technically allowable combination:

- A sliding axis of the piston between its first and second positions is parallel to a fitting axis of the first connector element of the plate and the first complementary connecting element.
- The maintaining member can act on at least one member for locking the piston in its first retracted position.
- The maintaining member can cover the locking member to lock the piston in its first retracted position.
- The locking member is radially movable relative to the sliding axis of the piston, between a first position locking the piston in its first retracted position and a second position releasing the piston.
- Along a sliding axis of the piston, in its first position, the locking member secures the piston in translation with the body of the piston, which in turn is fixed in translation relative to the plate.
- The locking member is secured in translation to the piston of the volume compensation device along a sliding axis of the piston.
- The piston is provided with a housing for partially receiving the locking member only in the first retracted position thereof.
- The system includes several locking members distributed around a central sliding axis of the piston.
- The maintaining member comprises a primary body fixed in translation relative to a body of the first complementary connector element, as well as a secondary body translatably movable relative to the fixed primary body, in a direction parallel to a fitting axis of the first connector element of the plate and the first complementary connector element while the secondary body is elastically pushed forward relative to the fixed primary body and the secondary body and/or the primary body can abut against the piston at least in the coupled configuration of the connector elements.

The secondary body can act on at least one locking member for locking the piston in its first position.

The primary body is provided with at least one bearing portion bearing against the piston in the coupled configuration of the first connector element of the plate and the first complementary connector element, while the primary body is positioned relative to the first complementary connector element such that, during the coupling of that connector element with the first connector element of the plate, the first element of the connector of the plate and the first complementary connector element are brought into the open configuration, before the bearing part of the primary body comes into contact with the piston.

In the coupled configuration of the first connector element of the plate and the first complementary connector element, the sum of the covering the length over which the maintaining member remains engaged with the locking member, measured parallel to a fitting axis of said connector elements, and an axial play between the primary body and the secondary body is greater than the closing travel of the closure member of the first connector element of the plate from the coupled configuration and parallel to the fitting axis of the connector elements.

The maintaining member is also secured to a second complementary connector element of a second connector element of the plate, at least in translation along their fitting axis, while that maintaining member can keep the piston in its first position, during the separation of the first elements of the connectors of the plate and the first elements of the complementary connectors, at least as long as each of the closure members of the first connector elements of the plate is not in the position closing off the respective inner duct of the connector elements.

BRIEF DESCRIPTION OF THE SEVERAL VIEWS OF THE DRAWINGS

The invention will be better understood, and other advantages thereof will appear more clearly, in light of the following description of two embodiments of the system according to its principle, provided solely as an example and done in reference to the appended drawings, in which.

DETAILED DESCRIPTION OF THE INVENTION

Figure 1:
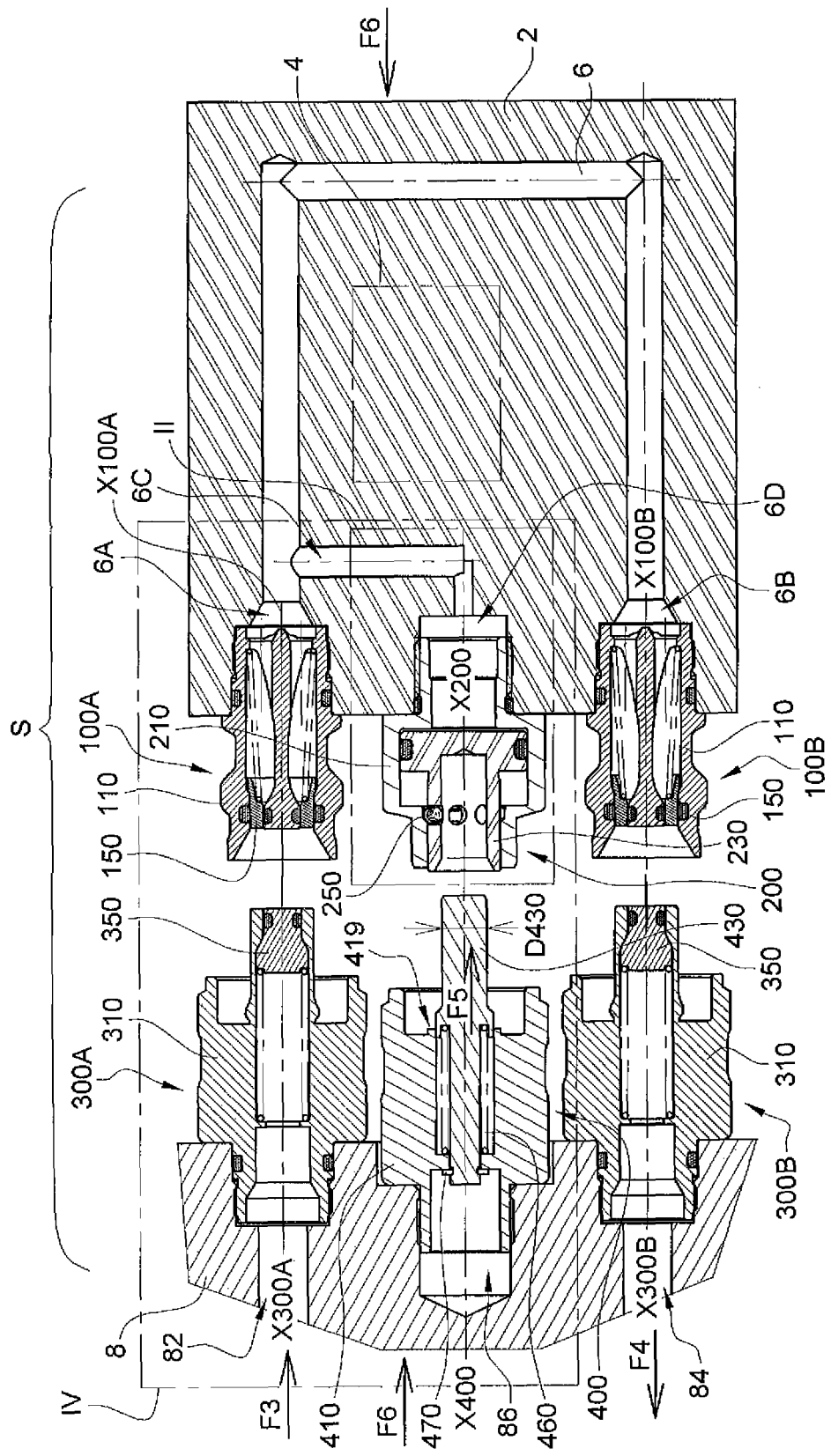
FIG. 1 is a diagrammatic block diagram of a system for cooling electronic components according to the invention.

In FIG. 1, a heat exchange plate 2 is used to cool an electronic component 4 of the insulated-gate bipolar transistor (IGBT) type or any other component that heats up during operation. A circulation duct 6 for a coolant, such as water or oil, is formed in the plate 2 and extends between a first end 6A and a second end 6B, at each of which a connector element 100A or 100B, respectively, is mounted.

These connector elements 100A and 100B are identical and each include a body 110 screwed into a corresponding tapped orifice of the plate 2 with the insertion of a seal 120. Each body 110 is hollow and defines a central bore 130 in which a push-piece 140 is arranged stationary relative to the body 110. The central bore 130 constitutes the inner duct of the connector element 100A. A closure member or valve 150 is mounted in the bore 130 and subject to the action of an elastic return spring 160 for returning the closure member 150 against a seat 112 formed by the body 110. Two seals 152 and 154 are respectively mounted in peripheral grooves of the body 110 and the push-piece 140, and ensure sealing of the closure of the element 100A or 100B in the configuration of the closure member 150 pressed against its seat 112. Each connector element is centered on axis X100A, X100B, respectively, parallel to which its closure member 150 moves relative to its body 110.

The duct 6 also comprises a branch 6C that forms a bypass relative to the part of the duct extending between the ends 6A and 6B and whereof the end opposite the part of the duct extending between the ends 6A and 6B is denoted 6D. Mounted on that end 6D is a volume compensation device 200 that comprises a body 210 whereof a tapped end is secured to the plate 2 by screwing in a corresponding housing of the plate 2, with the insertion of a seal 220. The body 210 is hollow and defines a central bore 212 that is stepped and inside which a piston 230 is mounted sliding along an axis X200 defined by the body 210. The axis X200 is a central axis of circular symmetry of the body 210 and the piston 230.

The axes X100A, X100B and X200 are parallel.

The piston 230 comprises a portion 232, which is hollow and whereof the outer diameter is denoted D232 and the inner diameter is denoted d232, as well as a solid wider portion 234 that closes off the portion 232. The portion 232 is therefore tubular, blind, and has a circular section. The portion 234 is also circular, and its outer diameter, which is denoted D234, is slightly smaller than the maximum inner diameter d212 of the bore 212, in the part thereof in which the portion 234 is housed. The portion 234 is provided with an outer peripheral groove 236 in which a seal 240 is housed compressed against the inner radial surface of the body 210 in the part thereof with a larger inner diameter d212. In this way, the piston 230 is mounted with the possibility of sealably sliding inside the body 210, between the positions respectively shown in FIGS. 2 and 3.

The front of the device 200 is defined as being oriented opposite the plate 2, while the rear of said device is oriented toward the plate 2. In this way, the arrow F1 in FIG. 2 is oriented from the back to the front of the device 200, while the arrow F2 is oriented from front to back.

Figure 2:
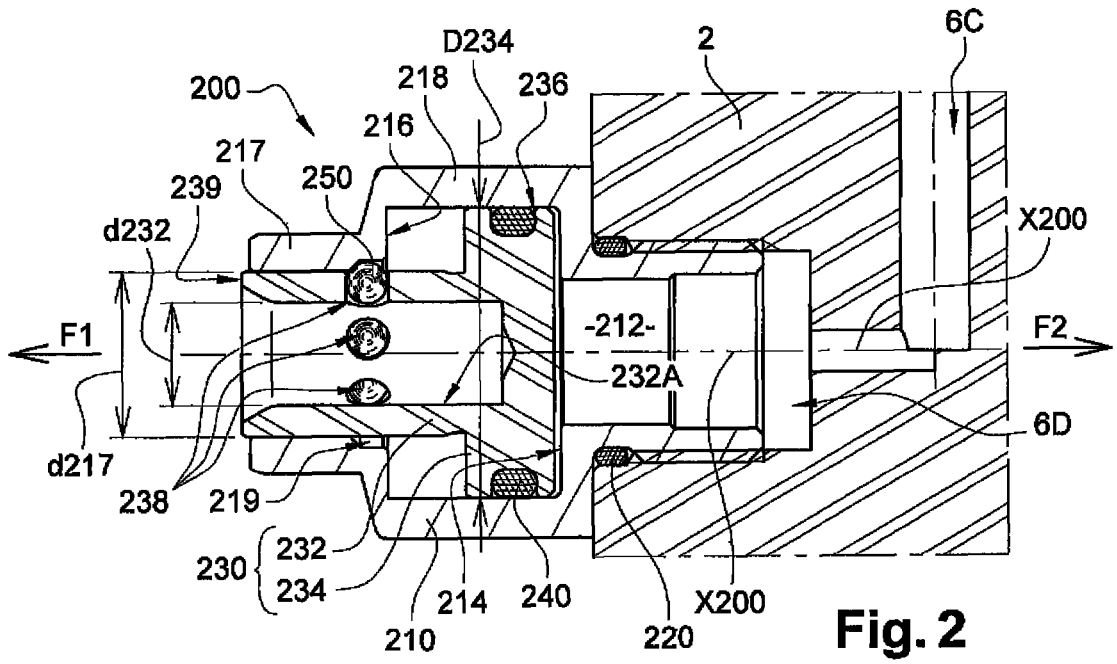
FIG. 2 is an enlarged view of detail II in FIG. 1.
Figure 3:
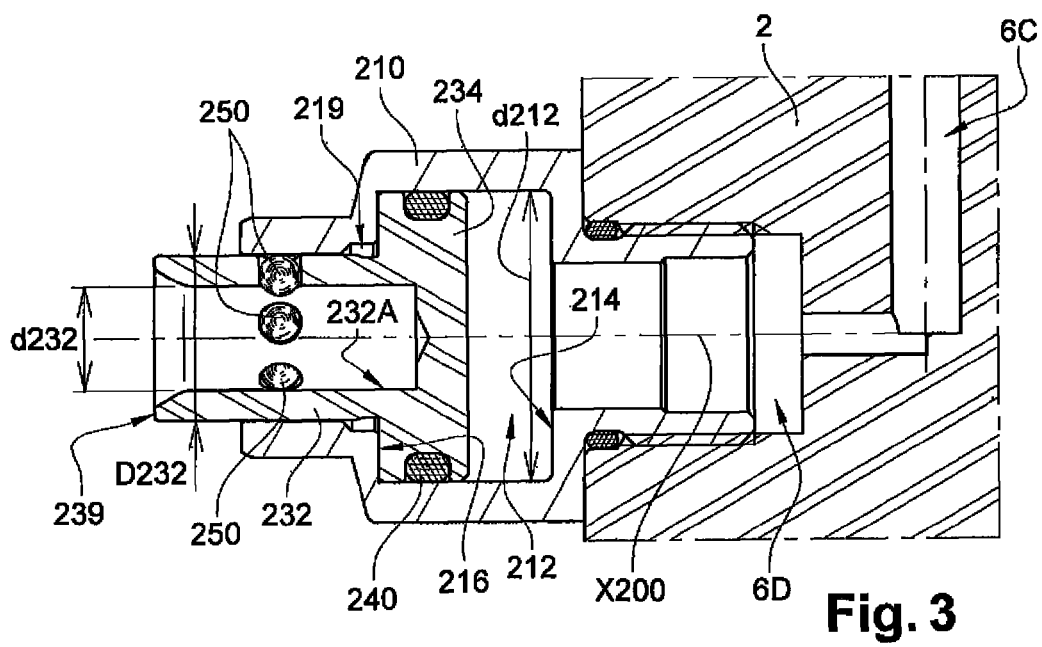
FIG. 3 is a view similar to FIG. 2 when a piston of the system of FIG. 1 is in another position.

In FIG. 2, the piston 230 is in a position retracted inside the body 210 in which its portion 234 is close to a rear shoulder 214 defined by the body 210. In FIG. 3, the piston 230 is in a forward position relative to the position of FIG. 2 in which its portion 234 is close to a front shoulder 216 defined by the body 210.

The portion 232 is pierced, radially relative to the axis X200, with eight orifices 238 that are regularly distributed around that axis and in each of which a ball 250 is housed.

Furthermore, the body 210 comprises a front portion 217 that is circular and whereof the inner diameter d217 is slightly larger than the diameter D232, such that the portion 217 constitutes a part for guiding the translation of the portion 232 of the piston 230. Additionally, reference 218 designates the portion of the body 210 whereof the inner diameter d212 is the maximum diameter of the bore 212 and that receives the portion 234 of the piston 230. Inside the body 210, and at the junction between the portions 217 and 218, an annular housing 219 is provided in the form of a portion with a wider diameter relative to the diameter d217. This housing 219 makes it possible to partially receive the balls 250 engaged in the orifices 238, when said balls do not protrude radially toward the axis X200 from the inner radial surface 232A of the portion 232.

When the balls are maintained in the housing 219, they lock the translational movement of the piston 230 in the forward direction, i.e., in the direction of the arrow F1. On the contrary, when the balls can freely protrude radially inward, from the surface 232A, they do not oppose the translation of the piston 230 in the forward direction, from its position of FIG. 2. In this respect, the diameter of the orifices 238 near the surface 232A is slightly smaller than that of balls 250 to prevent the balls from going completely into the inner volume of the portion 232.

When the plate 2, the connector elements 100A and 100B, and the compensation device 200 are in the configuration of FIGS. 1 and 2, i.e., when the duct 6 is insulated from the outside by the closure members 150 with the connector elements 100A and 100B separated from the connector elements 300A and 300B, in the event of a temperature increase of the coolant in the duct 6, in particular due to the transmission of calories by the component 4, the rise in the pressure of the coolant amounts to a pressure increase, including at the end 6D of the branch 6C. This results in exerting a force on the rear surface of the portion 234 that moves the piston 230 forward, in the direction of arrow F1 in FIG. 2. This forward movement of the piston 230 is possible because the inner volume of the portion 232 across from the balls 250 is unoccupied and the balls 250 can be driven from the housing 219 and protrude radially inward relative to the surface 232A. The piston 230 then goes from the configuration of FIG. 2 to the configuration of FIG. 3 or an intermediate configuration between those figures, by increasing, relative to the configuration of the piston 230 in the retracted position, the available volume in the bore 212 and therefore in the duct 6 for the coolant present in the plate 2, thereby limiting its pressure increase. In the forward position of the piston 230, the fluid in fact occupies a part of the volume of the bore 212 arranged at the portion 218 of maximum diameter d212, part arranged behind the part 234 of the piston. The amplitude of the potential travel of the piston 130 is determined such that the pressure of the fluid confined in the duct 6 remains below a pressure value for which the plate 2 and its components could be altered. In this embodiment, the amplitude of the potential travel of the piston 130 is approximately 15 mm for a diameter d212 of approximately 50 mm. This movement of the piston 230, under the effect of the pressure difference between the duct 6 and the outside of the plate 2, occurs without leakage at the compensation device 200 owing to the sealing provided by the seal 240 between the inner radial surface of the body 210 at its portion 218 and the outer radial surface of the piston 230 at its wider portion 234.

The system S according to the invention comprises not only the plate 2, but also a connector plate 8 inside which two ducts 82 and 84 are defined respectively serving to supply the duct 6 with refrigerated coolant and to discharge that coolant from the duct 6. The duct 82 is connected to a refrigerated coolant source (not shown) and the duct 84 is connected to a discharge line for discharging the coolant toward another treatment unit (also not shown). In FIG. 1, the arrows F3 and F4 show the direction of flow of coolant in the ducts 82 and 84 when the latter are connected to the duct 6. At the ends of the duct 82 and 84 oriented toward the plate 2, two connector elements 300A and 300B complementary to the elements 100A and 100B are respectively mounted. These connector elements 300A and 300B are identical and each comprise a body 310 whereof a threaded part is screwed into a corresponding tapping of the plate 8, with the insertion of the seal 320. The central bore 330 of each body 310 is closed by default by a closure member 350 subject to the action of an elastic return spring 360. A seal 352 is mounted on the closure member 350 and ensures sealing between the bore 330 and the outside of the connector element when the closure member 350 bears against a seat 312 defined by the body 310. A tubular part of the body 310 inside which the closure member 350 is housed in the closed position and that delimits the seat 312 is denoted 340. This tubular part 340 protrudes from the rest of the body 310, opposite the duct 82 or 84 on which the complementary connector element 300A or 300B is mounted. During the connection of the connector elements 100A and 300A or 100B and 300B, the part 340 serves as a push-piece to move the closure member 150 against the action of the spring 160.

The plate 8 also bears a maintaining member 400 designed to act on the piston 230 of the device 200. This member 400 comprises a primary body 410 whereof a threaded part is screwed into a blind tapping 86 of the plate 8. The primary body supports a finger 430, which is mounted on the primary body 410 and forms a secondary body translatable along an axis X400 parallel to the respective longitudinal axes X300A and X300B of the complementary connector elements 300A and 300B, along which the closure members 350 move. The maintaining member 400 is secured to the plate 8 along the axis X400 in the direction where its configurations depend on the axial position along the axis X400 of the plate 8 relative to the plate 2. A spring 460 exerts an elastic force on the finger 430 that tends to push said finger opposite the bottom of the tapping 86, in the direction of the arrow F5 of FIG. 1. The movement of the finger 430 under the action of the spring 460 is limited by a circlips 470 mounted on one end 432 of the finger 430 turned toward the bottom of the bore 86 and which bears against the shoulder 412 of the primary body 410.

For the elements 300A, 300B and 400, the rear side is defined as the side turned toward the plate 8, i.e., respectively toward the duct 82 and 84 and toward the bottom of the bore 86, and the front of those elements is defined as being turned opposite the plate 8. In this way, by default, the springs 360 and 460 push the closure members 350 and the finger 430 forward relative to the bodies 310 and 410.

The bodies 110, 210, 310 and 410 are rigidly mounted, respectively on the plates 2 and 8, such that it is possible to simultaneously align the axes X100A and X300A, the axes X100B and X300B, and the axes X200 and X400. This is possible by using the same spacing between the axes X100A, X100B and X200, on the plate 2, and the axes X300A, X300B and X400, on the plate 8.

It is thus possible, by acting on the plates 2 and 8, to exert a force bringing the connector elements 100A and 300A, on the one hand, 100B and 300B, on the other hand, closer together, and bringing the finger 430 and the piston 230 into contact. When the duct 82 and 84 needs to be connected with the duct 6, starting from the configuration of FIGS. 1 and 2, the axes X100A, X300A, X100B, X300B, X200 and X400 are respectively aligned and an approach force is exerted, in the direction of the arrows F6 in FIG. 1. The axes X100A and X300A, which are then combined, constitute fitting axes of the elements 100A and 100B. The same is true for the axes X100B and X300B and the elements 100B and 300B. This movement results in engaging the connector elements 100A and 100B of the plate 2 respectively with the connector elements 300A and 300B of the plate 8, by spacing the closure members 150 and 350 away from their respective seats, which makes it possible to establish a coolant flow between the duct 6 and the ducts 82 and 84.

Figure 5:
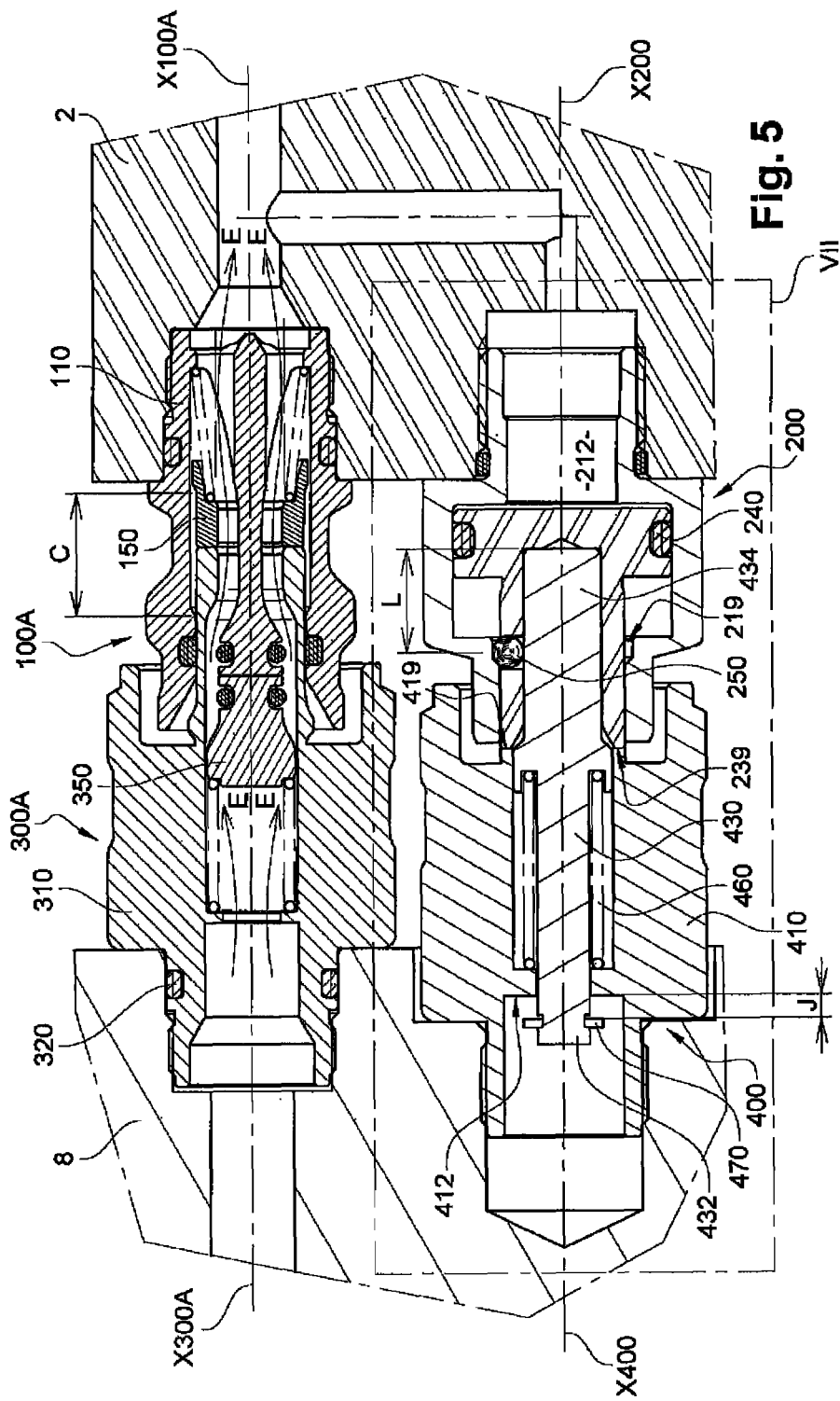
FIG. 5 is a view similar to FIG. 4 in the connected configuration of the connector elements shown in that figure.

When the piston 230 is in the position of FIG. 2 at the beginning of bringing the plates 2 and 8 close together, the approach movement also results in engaging the finger 430 in the inner volume of the portion 232 of the piston 230, which is possible because the outer diameter D430 of the front part 434 of the finger 430 is slightly smaller than the diameter d232. The insertion of the finger 430 into the inner volume of the portion 232 until it abuts against the bottom of the inner volume of the portion 232 is possible because the balls 250 can be driven radially outward, in the housing 219, as shown in FIG. 5. In parallel, the two connector elements 100A and 300A are sealably connected, without leakage.

Figure 4:
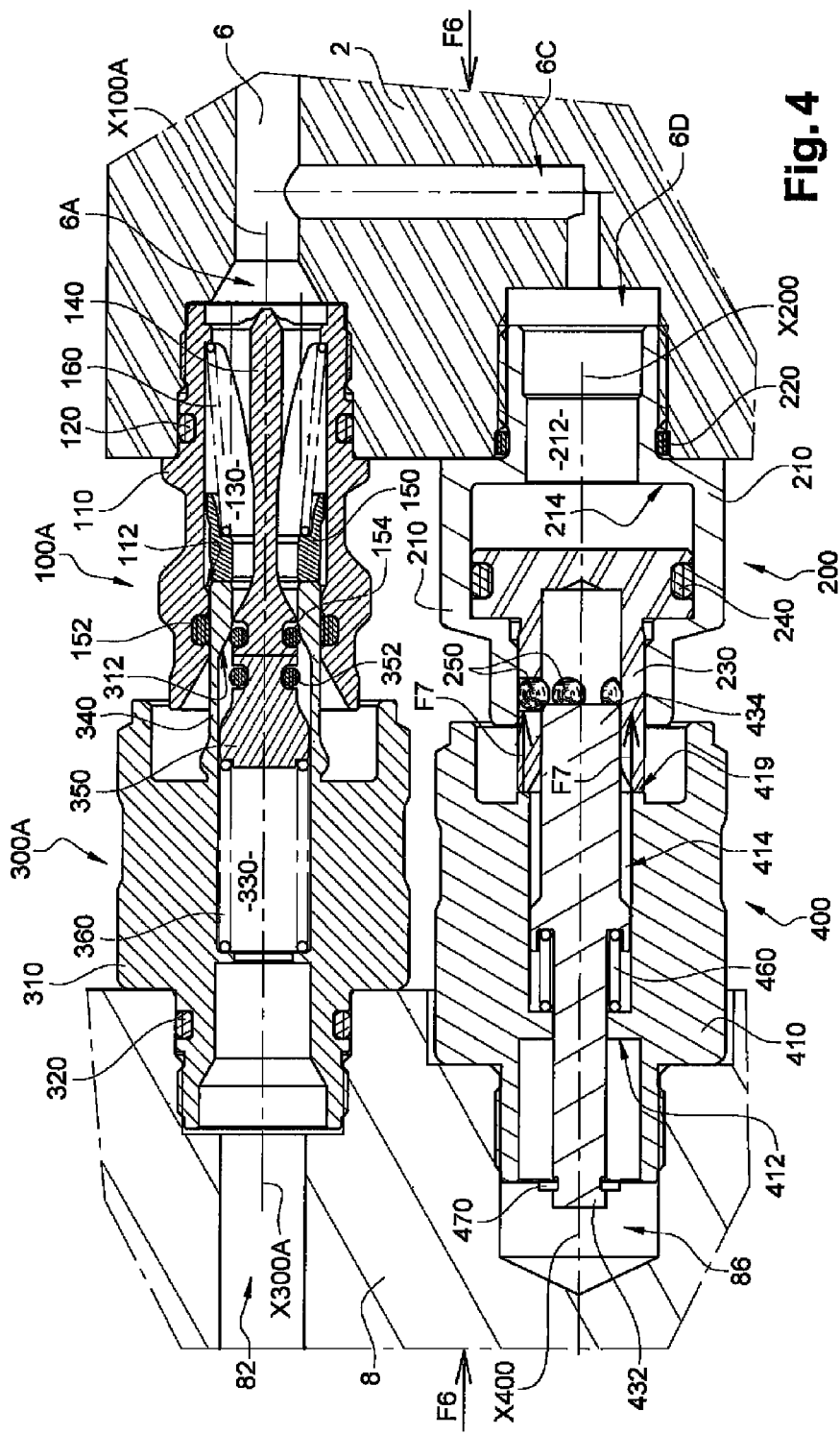
FIG. 4 is an enlarged view corresponding to detail IV in FIG. 1 during coupling of the connector elements shown in the upper portion of that figure from a configuration where the piston is in the configuration of FIG. 3.

When the piston 230 has been moved forward to perform a volume compensation function as explained above, and in the event the plates 2 and 8 are brought closer together to proceed with a connection of the connector elements 100A and 100B, respectively, with the connector elements 300A and 300B, this approach puts the closure members of the connector elements in contact with the corresponding push-pieces, whereas the finger 430, which engages in the piston 230, abuts, by its front part 434, against the balls 250, which radially protrude toward the axis X200 from the surface 232A. As long as the connector elements 100A, 100B, 300A and 300B are not open, i.e., as long as the closure members 150 and 350 are not freed from their respective seats, the pressure in the duct 6 keeps the piston 230 in the forward position, i.e., in the position of FIG. 3, or in an intermediate position between those of FIGS. 2 and 3. The finger 430 therefore cannot progress toward the portion 234 of the piston 230, as it is locked by the balls 250 maintained radially toward the inside relative to the surface 232A by the inner surface of the front portion 217. The approach movement of the plates 2 and 8 remains possible because the finger 430 can slide in the corresponding housing 414 formed to that end in the primary body 410, against the action of the spring 460. In other words, the sliding assembly of the finger 430 on the primary body 410 makes it possible for the finger to withdraw into its housing to reach the configuration of FIG. 4, where the closure members 150 and 350 reach the open position, without generating leakage with the tubular part 340, which comes in contact with the seal 152, while the piston 230 remains in the forward position, which makes it possible to establish a flow of coolant shown by the arrows E. This makes it possible to equalize the coolant pressure between the duct 6 and the ducts 82 and 84 and to decrease the pressure in the part of the bore 212 of the body 210 that is fluidly connected to the branch 6C of the duct 6.

In this configuration, the front edge 239 of the piston 230, i.e., the edge thereof opposite the end 6D of the branch 6C, is in contact with an annular bearing surface 419 of the body 410 that surrounds the housing 414 in which the finger 430 slides. The surface 419 then exerts, during the continuation of the movement bringing the plates 2 and 8 closer together in the direction of the arrows F6, a force shown by the arrows F7 in FIG. 4 that pushes the piston 230 toward the rear shoulder 214 to bring it into its retracted position of FIG. 2. The movement of the piston 230 inside the body 210 is possible due to the pressure decrease in the duct 6 following the opening of the connector formed from the elements 100B and 300B. During this movement, the finger 230 remains bearing against the balls 250 because it is subject to the action of the spring 460. In other words, the finger 430 accompanies the retraction movement of the piston 230 inside the body 210. When the piston 230 reaches its retracted position of FIG. 2, the balls 250 are radially across from the housing 219 and the force exerted by the spring 460 on the finger 430, force which tends to push the finger 430 toward the portion 234 of the piston 230, radially pushes the balls 250 back toward the housing 219. In other words, the finger 430 engages radially between the balls 250, which it returns toward the housing 219, in a configuration where those balls lock the piston 250 in its retracted position of FIGS. 1 and 2, i.e., prevent the forward movement of the piston 250. The spring 460 then pushes the finger 430 in the configuration of FIG. 5, where the front part 434 of the finger 430 bears against the bottom of the central hollow housing of the portion 232.

The connector elements 100A, 100B and 300A, 300B reach their coupled position when the plates 2 and 8 reach a connected position, in which they are kept. In disconnected position of the plates, axial play J remains between the circlips 470 and the shoulder 412. In this position, the finger 430 covers the balls 250 and keeps them engaged in the housing 219, which secures the piston 230 in translation with the body 210 along the axis X200 and locks it in the position retracted in the body 210. The piston 230 is also kept in the retracted position by the shoulder 419 in contact with the piston 230. In this way, the body 410 and the piston 430 abut against the piston 230 in the coupled configuration. Alternatively, only one of these elements abuts against the piston 230 in that configuration.

In this connected configuration shown in FIG. 5, the elements of the connector 100A and 300A on the one hand, and 100B and 300B on the other hand, are connected and on. In this position, the closure member 150 of the connector element 100A is offset, along the axis X100A, relative to its position closing off the bore 130. The shift, considered axially between the closure member 150 and its seat 112, corresponds to the closing travel C of the closure member 150 from the configuration of FIG. 5. The closure travel of the closure member 150 of the connector element 100B is also equal to the closure travel C because the connector elements 100A, 100B are identical.

Also in this configuration, the finger 430 abuts against the piston 230 and is engaged, inside the piston 230 and beyond the centers of the balls 250, over a length L that corresponds to the covering length between the finger at 430 and the balls 250 on which the finger 430 remains engaged with the balls 250 when it is withdrawn, opposite the plate 2, from the coupled configuration. The sum of the distance L and the play J is greater than or equal to the travel C. In other words, the following relationship is verified:

$$L+J \geq C$$

If the connector elements 100A and 100B were not identical, it would be necessary to verify that the sum of the distance L and the play J is greater than or equal to the largest of the travels C respectively considered at the connector element 100A and the connector element 100B.

Figure 6:
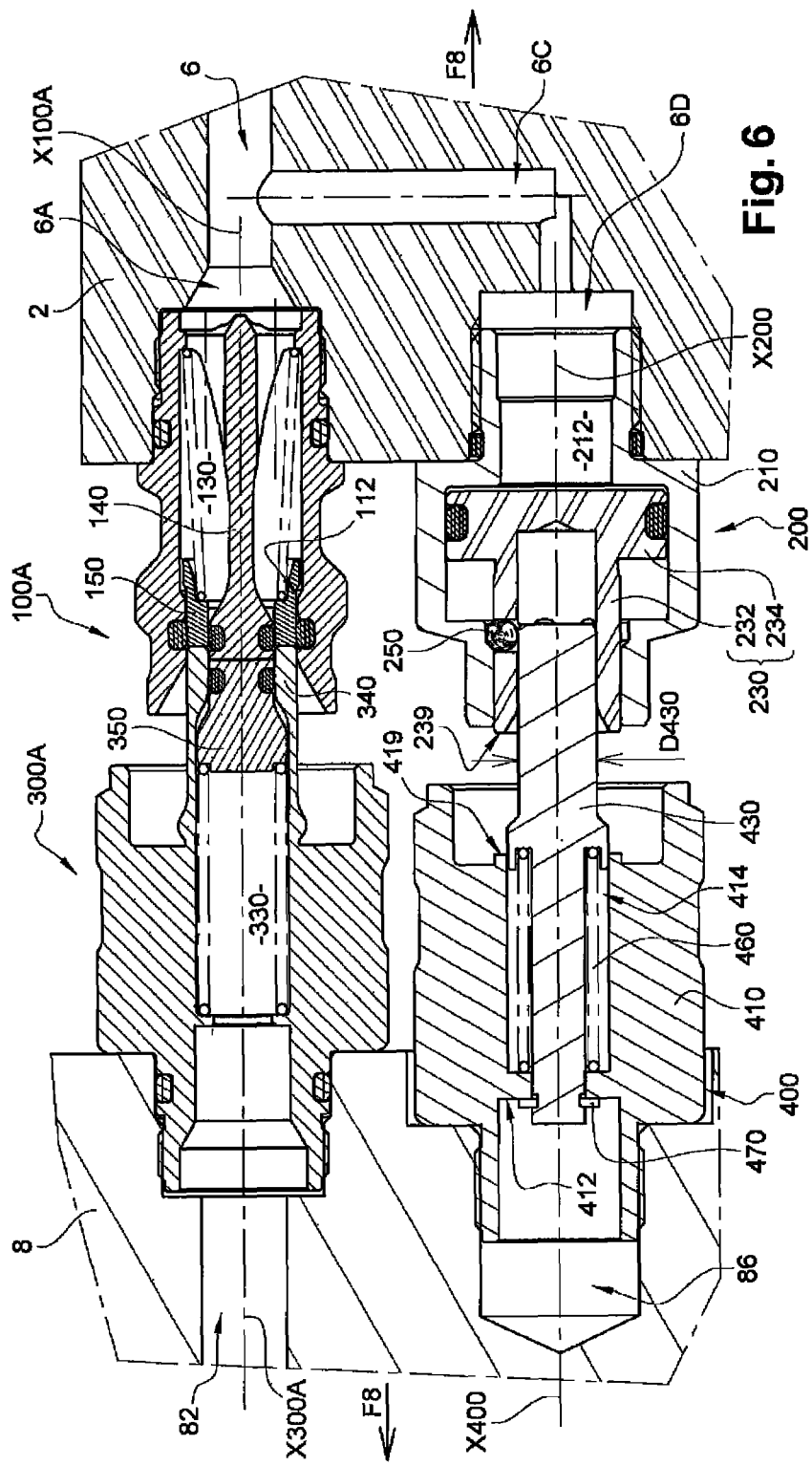
FIG. 6 is a view similar to FIG. 5 during the disconnection of the connector elements shown in that figure.

When the duct 6 needs to be isolated from the duct 82 and 84, the operator places the ducts 6, 82 and 84 "without pressure," i.e., at atmospheric pressure, and the plates 2 and 8 are separated from each other as shown by the arrows F8 in FIG. 6. This results in separating the elements 100A and 300A on the one hand, and 100B and 300B on the other hand, such that the closure members 150 and 350 are pushed back by the springs 160 and 360 toward their configuration closing the bores 130 and 330.

During this separating movement, the finger 430 remains abutting against the piston 230 until it abuts against the shoulder 412, then the finger 430 follows the movement of the plate 8 and is gradually removed from the inner volume of the piston 430. As shown in FIG. 6, inasmuch as the some of the length L and the play J is larger than the travel C, the finger 430 remains radially engaged between the balls 250 and acts on the balls 250 at least until the closure member 150 of the connector element 100A and the closure member of the connector element 100B reach the sealed closing configuration of the respective bores 130. It is thus guaranteed that piston 230 is locked by the balls 250 in its retracted configuration at least as long as each of the closure members 150 is not in position closing off the associated bore 130, and therefore as long as the duct 6 is not isolated from the duct 82 and 84. The continuation of the separating movement of the plates 2 and 8, from the configuration of FIG. 6 to the separated configuration of the connectors on the plates, results in finishing bringing the closure members 150 and 350 toward their position of FIG. 1 and removing the finger 430 from the piston 230. The finger 430 therefore no longer acts on the balls 250, and the piston is therefore freed in the separated configuration of the connectors and the plates.

One is then in the configuration of FIG. 1, where, as a function of the pressure increase in the duct 6, the piston 230 can go from its retracted position to a forward position, increasing the available volume for the coolant contained in the plate 2.

Figure 7:
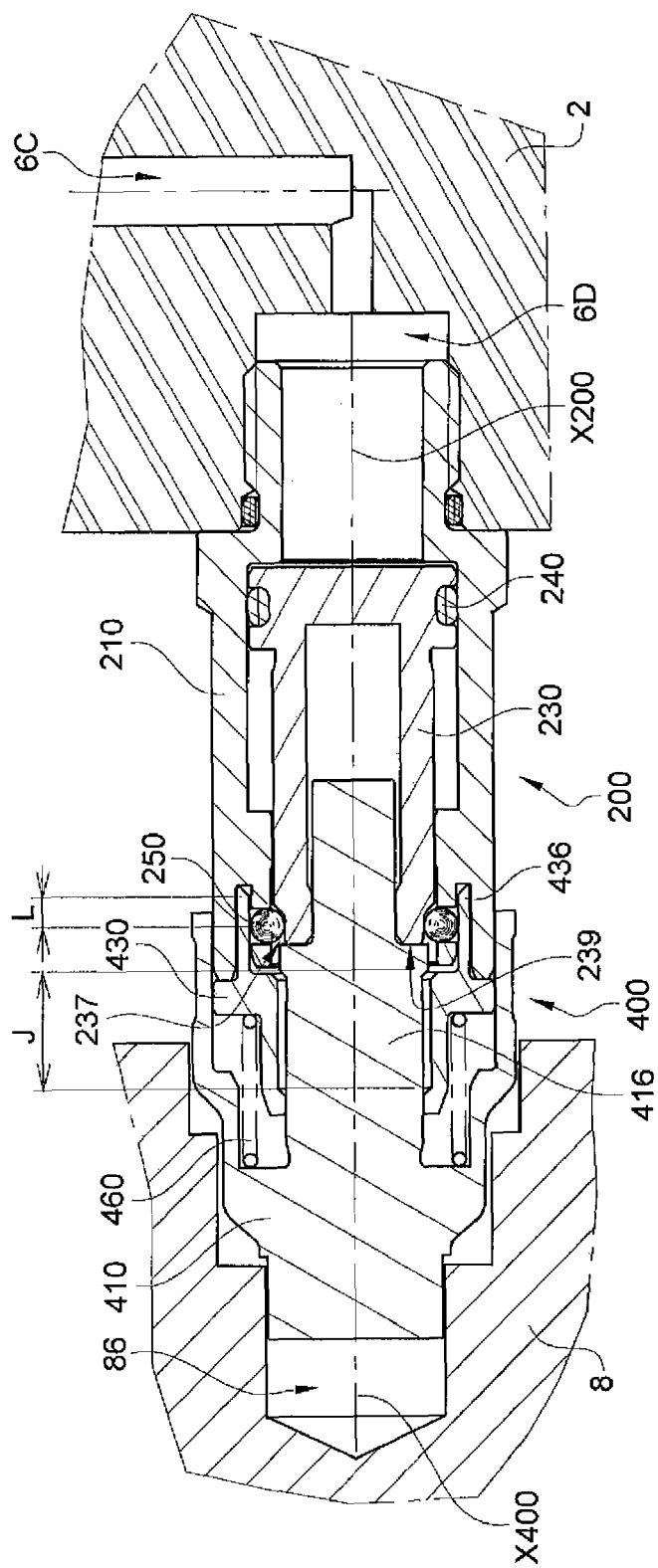
FIG. 7 is a view comparable to detail VII in FIG. 5 for a system according to a second embodiment of the invention.

In the second embodiment shown in FIG. 7, the elements similar to those of the first embodiment bear the same references. In the following, one will only describe what differentiates this embodiment from the previous one.

In this embodiment, the balls 250, radially movable in housings formed in the body 210, are secured in translation to the body 210 along the axis X200 and the housing for receiving the locking balls 250 is not provided on the inside of the body 210 of the volume compensation device 200, but on the outside of the piston 230, in the vicinity of the front edge 239 thereof. In FIG. 7, this housing bears reference 237 and the balls 250 are radially engaged therein, under the action of a maintaining ring 430 supported by the maintaining member 400 and whereof a skirt 436 radially surrounds the balls 250 to cover them in the connected configuration shown in FIG. 7. Balls 250 then lock the piston in the retracted position. The maintaining ring 430 is subject to the action of the spring 460 and guided around a central part 416 of a primary body 410 of the maintaining member 400. In the closed off configuration of the duct 6, once the piston 230, under the effect of the pressure, slides toward its forward position, the balls 250 leave the housing 237. Thus, the movement of the balls 250 between their position locking the piston 230 in the retracted position and their position releasing the piston is a radial and centrifugal movement, whereas that movement is radial and centripetal in the embodiment of FIGS. 1 to 6. Otherwise, this embodiment operates generally like the first embodiment, with the same advantages. For this embodiment, the distance L and the play J are defined as in the first embodiment. The distance L is the distance over which the skirt 436 of the maintaining member 400 remains engaged with the balls 250 during the separation. The play J is the play between the ring 430 and its front abutment on the body 410 in the coupled position of FIG. 7. The travel C is not shown in this figure, but corresponds to that identified in FIG. 5. As in the first embodiment, the following relationship is verified:

$$L+J \geq C$$

Irrespective of the embodiment, the compensation device 200 according to the invention is actuated owing to solely axial movements bringing the plates 2 and 8 closer together and further apart, without requiring a rotational movement as traditionally used in bayonet systems. This makes it possible to consider connecting the plates 2 and 8 through translational movements only, in particular using jacks.

The compensation within the device 200 occurs sealably and without leakage, including after a large number of connections/disconnections of the connector elements 100A and 300A on the one hand, and 100B and 300B on the other hand.

The maintenance of the piston 230 in the retracted position until closure of the connector element 100A is ensured by the balls 250 and the finger 430 of the first embodiment or the ring 430 of the second embodiment. It is not necessary to use a return spring that acts directly on the piston 230, which avoids the problems mentioned above relative to EP-A-1 790 458. The use of radially movable locking members, such as the balls 250, makes it possible to limit the axial forces to be exerted on the finger 430 to lock the piston 230 in the retracted position.

Furthermore, the maintenance of the piston 230 in its retracted position and its release upon passage to the separated position of the connector elements 100A and 300A, 100B and 300B are obtained automatically by the separating kinematics of the plates. The operator need only act on the volume compensation device 200 to arm them after disconnection of the plates.

The coupling kinematics, by coming closer together in the direction of the arrows F6, guarantees withdrawal of the piston 230 toward its retracted position when the latter is in a forward position at the beginning of the coupling. Here again, the operator needs only operate on the volume compensation device 200 before connecting the duct 6 to the ducts 82 and 84. In particular, the withdrawal of the piston 230 toward its retracted position is ensured by the force bringing the plates closer together that is transmitted by the primary body of the member 400 in the form of the force F7, which is significantly greater than the force that may be obtained using a spring acting directly on the piston 230.

According to alternatives of the invention, it is possible to consider locking members other than balls, for example one or more transverse bolts locked by a ring longitudinally movable along the compensation device 200. Alternatively, locking fingers movable along a transverse axis inclined relative to the radial direction can be used, said locking fingers being covered and maneuvered owing to a ring outside the compensation device.

The invention is shown in the figures in the case where the two connector elements 300A and 300B are supported by the same plate 8, which also supports the maintaining member 400. Alternatively, the system S according to the invention may comprise a maintaining member 400 secured to a support on which a single complementary connecting element is provided, for example the complementary connector element 300A in the figures. In this case, it is the connection of the connector elements 100A and 300A that makes it possible to act on the compensation device 200 owing to the maintaining member 400. During separation, the maintaining member 400 keeps the piston 230 in the retracted position while the valve 150 of the connector element 100A is not in the position closing off the bore 130 of the connector element 100A. In this case, the operator preferably separates the two connector elements 100B and 300B before separating the connector elements 100A and 300A.

The elements 2 and 8 mentioned in the description above are described as "plates" using the vocabulary in the field of heat exchangers for electronic components. In fact, these "plates" are not necessarily planar and may have any shape suitable for their function.

In the figures, the bodies 110, 210, 310 and 410 are shown as a single piece, for clarity of the drawing. In practice, they may be made up of several parts assembled together, in particular by screwing.

The invention has been described above in the case where the coolant is used to cool a component.

The invention is shown in the figures in the case where it is used in the field of cooling electronic components. It may be used in other fields, in particular for the temperature control of an injection mold for parts made from a synthetic material.

The features of the embodiment and alternatives mentioned above may be combined in whole or in part.

The body 410 may be rotatably mounted relative to the plate 8, like the body 310. In fact, the elements 310 and 400 need only be secured in translation to their respective support along the axis X300A, in the direction of the arrows F6 and F8, such that the elements housed in the elements 310 and 400 are also secured in axial translation to their support in the direction where their configurations depend on the axial position of the shared support along the axis X300A relative to the plate 2.

The invention claimed is:

1. A system for cooling at least one component or part, said system comprising:
   a heat exchange plate that includes a coolant circulation duct that includes first and second ends, connector elements at each of the first and second ends, each connector element being provided with a closure member, and a volume compensating device including a piston mounted to slide relative to the heat exchange plate, between a first retracted position and a second forward position relative to the first retracted position in which the volume available for coolant in the coolant circulation duct is increased relative to a volume in the first retracted position;
   a coolant supply source and coolant discharge line for the cooling duct, the supply source and the discharge fine including complementary connecting elements to the connector elements of the heat exchange plate for the connection and disconnection of the coolant circulation duct of the heat exchange plate with the coolant supply source and the coolant discharge line;
a maintaining member for retaining the piston in the first retracted position is secured to at least a first complementary connecting element associated with a first connector element of the heat exchange plate, at least in translation along a fitting axis of the first connector element, and wherein the maintaining member
   locks the piston in its first retracted position when the first connector element of the heat exchange plate and the first complementary connecting element are coupled, and
   retains the piston in the first retracted position during separation of the first connector element of the heat exchange plate and the first complementary connecting element, as long as the closure member of the first connector element of the heat exchange plate is not in a position closing off an inner duct of the first connector element.

2. The system according to claim 1, wherein a sliding axis of the piston between the first retracted and second forward positions is parallel to the fitting axis of the first connector element of the heat exchange plate and the first complementary connecting element.

3. The system according to claim 1, wherein the maintaining member acts on at least one member for locking the piston in the first retracted position.

4. The system according to claim 3, wherein the maintaining member covers the locking member to lock the piston in the first retracted position.

5. The system according to claim 3, wherein the locking member is radially movable relative to a sliding axis of the piston, between a first position locking the piston in the first retracted position and a second position releasing the piston.

6. The system according to claim 3, wherein, along a sliding axis of the piston, in the first retracted position, the locking member secures the piston in translation with the piston, and the piston is fixed in translation relative to the heat exchange plate.

7. The system according to claim 3, wherein the locking member is secured in translation to the piston of the volume compensation device along a sliding axis of the piston.

8. The system according to claim 3, wherein the piston is provided with a housing for partially receiving the locking member only in the first retracted position.

9. The system according to claim 3, including a plurality of locking members distributed around a central sliding axis of the piston.

10. The system according to claim 1, wherein the maintaining member includes a primary body fixed in translation relative to a body of the first complementary connecting element, as well as a secondary body translatably movable relative to the primary body, in a direction parallel to a fitting axis of the first connector element of the heat exchange plate and the first complementary connecting element, wherein the secondary body is elastically pushed forward relative to the primary body and wherein at least one of the secondary body and the primary body abuts against the piston at least in a coupled configuration of the connector elements.

11. The system according to claim 10, wherein the secondary body acts on at least one locking member for locking the piston in the first position.

12. The system according to claim 10, wherein the primary body is provided with at least one bearing portion bearing against the piston in the coupled configuration of the first connector element of the heat exchange plate and the first complementary connector element and wherein the primary body is positioned relative to the first complementary connector element such that, during coupling of that connector element with the first connector element of the heat exchange plate, the first connector element of the heat exchange plate and the first complementary connecting element are brought into an open configuration, before the bearing portion of the primary body contacts the piston.

13. The system according to claim 3, wherein, in a coupled configuration of the first connector element of the plate and the first complementary connecting element, a sum of a length L over which the maintaining member remains engaged with the locking member, measured parallel to a fitting axis of the first connector element and the first complementary connecting element, and an axial play J between a primary body of the maintaining member, the primary body being fixed in translation relative to a body of the first complementary connecting element, and a secondary movable body of the maintaining member is greater than a closing travel distance C of the closure member of the first connector element of the heat exchange plate from a coupled configuration and parallel to the fitting axis of the first connector element and the first complementary connecting element.

14. The system according to claim 1, wherein the maintaining member is also secured to a second complementary connecting element associated with a second connector element of the heat exchange plate, at least in translation along a fitting axis of the second complementary connecting element and the second connector element, and wherein the maintaining member retains the piston in the first position, during a separation of the first and second connector elements of the heat exchange plate and the first and second complementary elements, at least as long as each of the closure members of the first and second connector elements of the heat exchange plate is not in the position closing off the inner duct of each of the first and second connector elements.

* * * * *